United States Patent
Bregman et al.

[11] Patent Number: 5,189,363
[45] Date of Patent: Feb. 23, 1993

[54] INTEGRATED CIRCUIT TESTING SYSTEM HAVING A CANTILEVERED CONTACT LEAD PROBE PATTERN MOUNTED ON A FLEXIBLE TAPE FOR INTERCONNECTING AN INTEGRATED CIRCUIT TO A TESTER

[75] Inventors: Mark F. Bregman, Ridgefield, Conn.; Paul R. Hoffman, Santa Clara, Calif.; Peter G. Ledermann, Ossining, N.Y.; Paul A. Moskowitz, Yorktown Heights, N.Y.; Roger A. Pollak, Pleasantville, N.Y.; Timothy C. Reiley, Los Gatos, Calif.; Mark B. Ritter, Brookfield, Conn.

[73] Assignee: IBM Corporation, Armonk, N.Y.

[21] Appl. No.: 583,261

[22] Filed: Sep. 14, 1990

[51] Int. Cl.⁵ .................................................. G01R 31/02
[52] U.S. Cl. ...................................... 324/158 P; 324/158 F; 439/482
[58] Field of Search .......... 324/158 F, 158 P, 72.5; 439/482; 29/842; 174/52.4; 357/71

[56] References Cited

U.S. PATENT DOCUMENTS

| | | | |
|---|---|---|---|
| 3,405,361 | 10/1968 | Kattner et al. | 324/158 P |
| 3,493,858 | 2/1970 | Baron et al. | 324/158 P |
| 3,568,831 | 3/1971 | Penberg | 324/158 P |
| 3,810,016 | 5/1974 | Chayka et al. | 324/158 P |
| 3,826,984 | 7/1974 | Epple | 324/158 P |
| 3,838,984 | 10/1974 | Crane et al. | 174/52.4 |
| 4,065,717 | 12/1977 | Kattner et al. | 324/158 P |
| 4,523,144 | 6/1985 | Okubo et al. | 324/158 P |
| 4,574,235 | 3/1986 | Kelly et al. | 324/158 F |
| 4,649,338 | 3/1987 | Dugan | 324/158 P |
| 4,649,339 | 3/1987 | Grangroth et al. | 324/158 F |
| 4,673,839 | 6/1987 | Veenendaal | 324/158 F |
| 4,677,474 | 6/1987 | Sato et al. | 324/158 P |
| 4,733,172 | 3/1988 | Smolley | 324/158 F |
| 4,758,785 | 7/1988 | Rath | 324/158 P |
| 4,814,855 | 3/1989 | Hodgson et al. | 357/71 |
| 4,820,976 | 4/1989 | Brown | 324/158 P |
| 4,835,846 | 6/1989 | Juan et al. | 174/52.4 |
| 4,839,587 | 6/1989 | Flatley et al. | 324/158 P |
| 4,843,645 | 7/1989 | Doe et al. | 174/52.4 |
| 4,873,563 | 10/1989 | Roane | 357/71 |
| 4,912,399 | 3/1990 | Greub et al. | 324/158 F |
| 4,961,052 | 10/1990 | Tada et al. | 324/158 F |
| 4,975,638 | 12/1990 | Evans et al. | 324/158 P |
| 4,998,062 | 3/1991 | Ikeda | 324/158 P |
| 5,038,195 | 8/1991 | Brewer et al. | 357/80 |
| 5,064,706 | 11/1991 | Ueda et al. | 174/52.4 |

Primary Examiner—Vinh Nguyen
Attorney, Agent, or Firm—Sughrue, Mion, Zinn, Macpeak & Seas

[57] ABSTRACT

A system for testing chips uses a patterned tape having a patterned array of cantilevered contact leads. The tape serves as an interface between the chip under test and a testing unit by providing conductive leads from the I/O terminals on the chip to an off-chip measuring system. The leads on the array may have balls, tips or other shapes on the end to provide contact with the terminals and compensate for height differences. The tape is a single frame or has a series of arrays each positioned around an opening where the chip will be located when a particular pattern is positioned over that chip for test. The pattern on the tape may be the same array or a different array. The tape is indexed to a new pattern when the old one is damaged or no longer needed. Alignment with the chip is by optical sensing and physical pin movement. The tape may have a flap protruding into an aperture and deflectable to provide for planar contact of the leads to the device under test.

38 Claims, 3 Drawing Sheets

INTEGRATED CIRCUIT TESTING SYSTEM HAVING A CANTILEVERED CONTACT LEAD PROBE PATTERN MOUNTED ON A FLEXIBLE TAPE FOR INTERCONNECTING AN INTEGRATED CIRCUIT TO A TESTER

BACKGROUND OF THE INVENTION

This invention relates to integrated circuit testing systems and more particularly to a tape used as an interface between an electronic device and a test system.

Conventionally, integrated circuit devices are tested prior to dicing and packaging to determine whether defects are present. The evaluation of performance of such an integrated circuit is accomplished at various points in the manufacturing process and at the end of fabrication. In order to test such circuits, an electrical connection must be made to many of the integrated circuit's connection points. Test signals are then applied to the circuit and the performance is evaluated.

Within the art a variety of schemes have been devised for testing such integrated circuit devices. One problem is that the automated high-volume manufacturing of semiconductor wafers has advanced to the point that test apparatus must be similarly designed to handle high volumes of product to be tested. A single test station may be called upon to make thousand of tests per day. Each test requires that the contact array make and break contact to a different test site either on the same wafer or on a series of wafers in a reliable manner. The result of this test methodology is that the contact probes become worn and must be replaced frequently. The time required for replacement of a contact array removes the tester machine from operation. This adds to the cost of the semiconductor product.

Another problem is that as circuits continue to shrink it becomes increasingly difficult to perform wafer level electrical tests prior to packaging. Moreover, in the case of VLSI circuits, there is an increasing requirement for larger numbers of input and output (I/O) terminal connections. Consequently, as such circuits become increasingly complex with increased demands for I/O, the size and spacing of those I/O pads continually decreases. As the pitch reaches the order of a few mils, conventional probe systems are not available. Photolithographic techniques must be used to produce probe arrays for mil-sized pitches.

Yet another problem when using prior art systems for mil-sized pitch pads systems is the mechanical construction of the conventional probe. These systems cannot achieve high positional resolution, which may be compounded by wear and resurfacing by replanarizing techniques such as grinding. Again lithographic techniques are needed to produce the probe array.

Electrical interface problems also exist. The high number of I/O and high speeds of operation on contemporary VLSI chips increases the probability for induced noise when many off-chip drivers switch simultaneously during tests. This simultaneous switching places very vigorous demands on the electrical performance of the probe during tests. Present day schemes are very near the limits of usability, and are a source of erroneous test data. Probes must be designed to have minimum inductive coupling to reduce induced noise.

Representative of the prior art which has been used in the past for purposes of testing micro miniature components is U.S. Pat. No. 3,493,858, which relates to a flexible bag stretched over a frame having a series of conductors mounted thereon. The conductors consist of electroplated Cu, patterned by photolithography, on a mylar film. Compatibility between the terminal portions of both the flexible member and the device under test, is achieved by inflation the probe points are extended into contact with the corresponding terminal areas on the circuit.

U.S. Pat. Nos. 3,405,361 and 4,065,717 both relate to multi point probes employing flexible sheet-like members carrying probes to make contact with a semiconductor device. The pattern of the flexible sheet allows for contacts to be distributed around the member under test. This flexible member forms part of a chamber into which fluid is introduced so that it deforms and causes the probes to make contact with the semiconductor device. In the ±361 patent the probes formed by lithography have plated bump tips.

Techniques to take into consideration variations of the height of the pads on the device under test have also been considered in the prior art. U.S. Pat. No. 3,826,984 discloses a contact scheme having a series of cantilevered beams extending radially inward from a nonconducting support disk into a circular substrate opening. Another example of a cantilever type probe is found in U.S. Pat. Nos. 4,649,338 and 4,677,474. The contacts are allowed to deflect in the vertical direction to conform to height variations among the contact pads.

U.S. Pat. No. 3,832,632 deals with the problem of elevational differences by employing probe tips made of a compressible elastic material. An annular, cantilever design is employed.

U.S. Pat. No. 4,649,339 describes a probe with features smaller to those in the prior art above. This probe consists in a continuous flexible sheet without openings, with a series of conductive lines which fan out from a central aperture. The contacts consist of lithographically patterned Cu and the sheet is polyimide, without openings. The metal can be used on both sides of the film, creating a ground-plane controlled impedance structure. At the aperture, the lines are connected to contacts on the opposite side of the sheet. The contacts are used to form the electrical connection between the chip and connector pads. By means of a spring loaded central conductor, contact is made between terminals on the inner face and pads on the device under test. As in other prior art systems, the test probe head employs air pressure to exert the force necessary to bring the probe tips into contact with the device under rest.

Reference is made to U.S. Pat. No. 4,673,839, which also relates to a chip probe test system. This system employs a flexible probe in the form of a small square of thermal plastic polyimide film. The underside of the film includes a plurality of metal pads which are arranged in a pattern that matches the contact pads on the chip. The pads are electrically connected by the use of microstrip line geometry techniques, such as piezoelectric elements. Yet another example of a strip line for purposes of testing semiconductors is described in Japanese Laid-Open Application No. 60-260,861. An x-shape strip film having a number of connectors thereon is attached by a jig and moved into contact with a semiconductor device under test. By varying the force on the jig, the applied force to the contact terminals can be adjusted.

The above discussed art shows the use of integrally mounted probe arrays built into the tester apparatus. To the extent that a film is used with holes, such are simple round or square holes and is not continuous to provide more than one pattern on the film.

The above prior art reveals that a myriad of techniques have been proposed for testing integrated circuit elements. All have, to varying degrees, the deficiencies noted above.

SUMMARY OF THE INVENTION

An object of this invention is to provide for an improved probe for use with fine pitch pads on a chip.

Yet another object of this invention is to provide for a tape probe, which allows for low cost testing of VLSI chips.

Yet another object of this invention is to provide for a scheme by which probe elements are easily replaceable so that the test procedure can be used in a manner compatible with throughput in the fabrication of VLSI chips.

A further object of this invention is to provide a scheme for testing fine pitch I/O pads on VLSI chips.

Yet another object of this invention is to provide for improved electrical performance of high-speed AC testing and higher contact reliability over conventional probes thereby improving the reliability of the tests.

Another object of this invention is to provide a flexible circuit structure for fine pitch probe applications that reduces manufacturing cost yet improves mechanical integrity of the probe.

Another object is to provide a support structure for fine pitch probes that assures coplanarity.

Another object is to provide new materials that will not wear as quickly as conventional materials in the testing of electrical chips.

An additional object of this invention is to define a test structure which has a clear optical path to the ends of the test leads thereby simplifying alignment of the test leads with the structure under test.

These and other objects of this invention are provided by the use of a polymer tape having a series of patterned probes. Each of the probes has a series of metal patterns having leads which project into an opening (window) in the polymer. The lead ends are arranged to mate with the I/O pads of the chip under test. The lead ends terminate at the chip I/O pads in the form of planar beams or other shapes such as spheres or points which are formed during tape manufacture. The other ends of the leads terminate in pads or rounded balls which are arranged in a pattern that is convenient for connection to the remainder of the test apparatus. In this manner the tape provides a fan-out from the fine pitch pads on the chip under test to a coarser pitch of the tester. Such a probe is also applicable to an area array configuration of pads providing increased versatility in the potential number of test connections.

The tape may also have a metal layer providing a ground plane. The use of a tape having a ground plane permits controlled impedance from the device under test all the way to the test electronics.

The tape provides for easy replacement of the probe set by advancing the film if it becomes damaged or worn from use. Additionally, the tape may have consecutive frames with different test pad footprints so that chips having different pad designs can be probed without having to change the tape. The film is simply reeled in one direction until the proper test pad footprint is placed over the chip under test.

The tape leads may be made of copper, nickel-copper or other alloys to improve lifetime performance. The tape leads and probe ends are plated to increase reliability cycle life. Conventional metals used for plating are employed such as hard gold, palladium, nickel, and the like.

In operation, in accordance with one aspect of this invention, the tape probe is brought into contact with pads of a chip under test by applying pressure utilizing a pressure anvil to the back side of the probe tips. This allows for precise control of the probe pressure on the probe tips. The pressure anvil may be coated with an elastomeric material to compensate for any irregularities in the probe tips or lack of coplanarity with the wafer. Moreover, an elastomeric coating helps to spread the applied force uniformly among probe tips. The pressure anvil and coating may be transparent to aid in alignment.

In accordance with another aspect of this invention, the substrate is shaped to provide a slotted free-moving hinged flexible piece (flap) with the leads placed on that hinged slotted flexible portion of the substrate. For example, if a square hole is shaped by etch through the substrate a pair of independent slots are etched at each corner so that opposed leads may flex on the flaps. Independently this allows the probes mounted on the substrate to deflect uniformly and to maintain a planar orientation for purposes of contact. Other geometries may be used, such as a rectangle with cut-out corners or multiple slots. Thus, in accordance with this aspect of the invention the underlying substrate provides a freely bending supporting flap for the probe array.

This invention is however not limited to such geometries. For example, in the context of an area array, windows can be placed in the substrate at locations corresponding to the array. The metal traces which pass over the windows on the substrate can then be formed through the openings to provide an array of contact tips.

The ends of the leads may be coined to produce suitable shapes for probing. Such coining can take the configuration of a point, curve, or spheroid. A spheroid can be formed using the technology disclosed in U.S. Pat. No. 4,814,855. Materials used include gold-plated copper or alloys of nickel and copper. The substrate is typically an insulating polyimide substrate.

This invention will be described in greater detail by referring to the attached drawing and the description of the preferred embodiment that follows.

DESCRIPTION OF THE PREFERRED EMBODIMENT

Figure 1A:
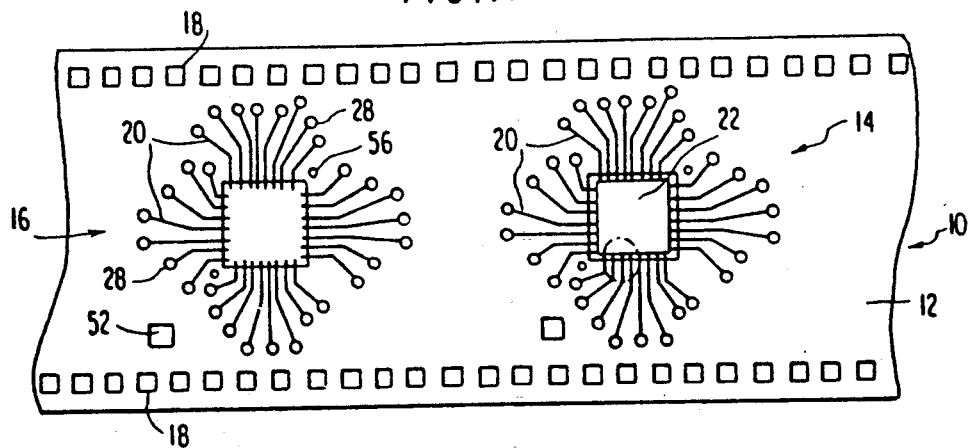
FIG. 1A is a schematic top view of a portion of the polymer tape probe of a first embodiment of this invention.
Figure 1B:
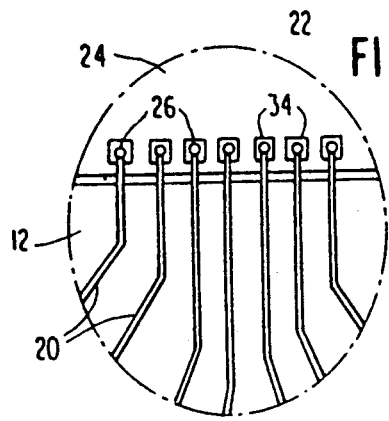
FIG. 1B is an enlargement of a portion of an individual probe section of FIG. 1A.

Referring first to FIGS. 1A and 1B, the polymer tape of this invention is depicted. The tape 10 is comprised of a polymeric film 12 which acts as a substrate. This substrate material is similar to that used in tape automated bonding (TAB) techniques where a plurality of metallic lead frames are patterned on a substrate and are subsequently bonded when aligned with a chip. In accordance with this invention the polymeric substrate 12 carries a patterned metal, for example, Au plated Cu in a plurality of test lead arrangements. One such pattern is identified as element 14 and an adjacent one as pattern 16 on the substrate 12. Additionally, a series of sprocket holes 18 may be formed on the edges of the tape 10 to advance the tape through the testing system.

As illustrated in detail in FIG. 1B, the patternized metal 14 provides a series of leads 20. Those leads project into a window 22, that is, a hole in the substrate 12. The particular pattern 20 has lead end terminators 26 designed to mate with the I/O pads 34 of a chip under test 24 (see FIGS. 1B, 1C and 2B). The leads 20 terminate at the chip end in planar beams, rounded balls, or other coined shapes (see FIGS. 8A-8C). Reference is made to U.S. Pat. No. 4,814,855, incorporated herein by reference, which describes one technique making a lead structure having contact ball tips.

The other ends of the leads 20 terminate in pads or balls 28, which are in turn patterned for connection to the test apparatus. The tape probe pattern may be customized to match the chip footprint. The tester-to-interface may have the same pattern irrespective to the lead pattern to the chip. Thus, as illustrated in FIG. 1A, the tape provides a fan-out from the fine pitch pads in contact with the chip under test to a courser pitch of the tester connection.

Figure 1C:
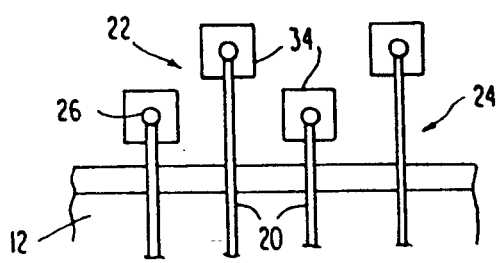
FIG. 1C is a modification of FIG. 1B illustrating a probe configuration for an area array.

While FIG. 1B illustrates the termination of the leads arranged along the edge of the window, in general conformity with the layout of I/O pads 34 on the chip under test, it is apparent that this invention is also applicable to an area array configuration of pads or staggered perimeter rows, as illustrated in FIG. 1C. In this figure the I/O pads 34 are staggered, hence the probe pattern 20 has probes of different lengths. Thus, the probes can be cantilevered to extend inward into the window to contact pads which are not disposed on the periphery of the chip. This makes this invention suitable for area and peripheral contact arrays.

Figure 2A:
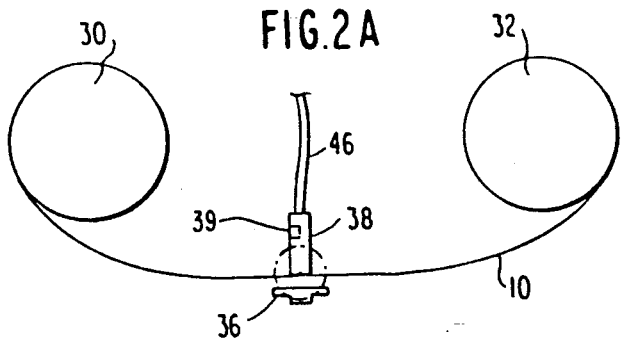
FIG. 2A is a schematic side view of the system used to test chips utilizing the tape probe of FIG. 1.
Figure 2B:
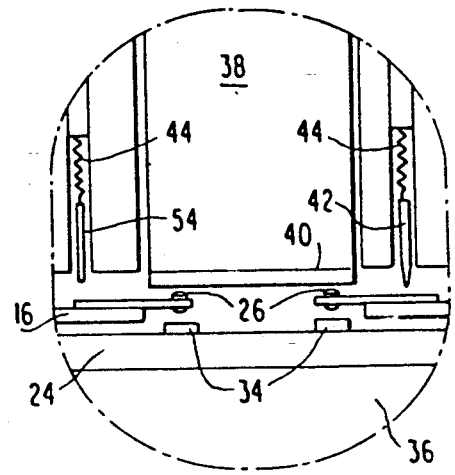
FIG. 2B is an enlargement of the test portion of FIG. 2A.

Referring now to FIGS. 2A and 2B, the system aspects of this invention are depicted. As illustrated in FIG. 2A, the tape is generally fed from one reel 30, a supply, to a take-up reel 32. The tape 10 is advanced until a lead pattern for use is in the test area positioned over a chip.

Coarse alignment of the film may be by the use of an optical sensor. The sensor determines the presence of an optical alignment hole 52 in the tape. Since the hole 52 is at a predetermined position relative to the pattern, the tape can be stopped to place the pattern into coarse alignment with the chip at the test site. As illustrated in FIG. 2B, the lead frame is thus coarsely aligned with the chip under test 24. Fine alignment is obtained through optical techniques using the transparent pressure anvil and the substrate as a window.

Coarse alignment may also occur by the use of a pin (or pins) 54 which is/are lowered to engage hole 56 on the tape. Slight movements of the tape allow the pin to pass through and into position with a lower guide, not illustrated. Vacuum techniques may be used to hold the tape in place.

Thus, the terminal ends 26 of the tape are placed in alignment with the I/O pads 34 on the chip. The chip under test 24 is held in place on a wafer stage 36. This provides a firm backing for the application of force from above without damaging the chip. The stage also provides the means by which chips can be finely positioned for purposes of processing and testing. By means of a pressure anvil 38, the probes are caused to deflect uniformly and contact all of the pads 34.

The pressure anvil 38 is preferably made of a transparent material such as glass or plastic or silicone rubber to allow for manual or automated optical alignment and inspection of the test site and test probes. The pressure anvil illustrated in FIG. 2B has a flat surface to distribute pressure uniformly to all of the probe leads. In the case of the embodiment of FIG. 6, the anvil may have beveled sides 39 to provide the necessary bearing surface for uniform deflection of the flaps. In this technique the flaps will be hinged downward toward to the device under test providing adequate stand-off.

Given the cantilever action of each of the leads, discrepancies in variations in elevation of the pads is effectively compensated for by this arrangement. Also illustrated in FIG. 2B is the use of an elastomeric layer 40 on the anvil 38. This material is used to compensate for further irregularities in beam size or deformation.

As illustrated in FIG. 2B a series of tester contacts 42 each of which are spring loaded by means of springs 44 are placed in conjunction with each of the leads 20. The tester contacts are sequentially actuated to contact the lead 20. They provide a tester connection from the I/O pad through the lead and via a cable 46 to the tester electronics, not illustrated. The chip under test is thus tested for electrical continuity, opens, and shorts or dynamic circuit response by means of selective activation of the tester contacts 42.

Figure 3:
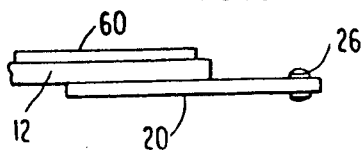
FIG. 3 is a partial schematic illustrating a modified embodiment utilizing a ground plane layer.

The tape may be provided with a second metallized layer 60 (FIG. 3) to provide a ground plane. This can provide a controlled impedance all the way from the tester to the chip. High speed AC testing is thus possible. As illustrated in FIG. 3, the polymeric substrate 12, which is insulating, separates the metallic lead 20 from the ground plane 60.

Alternatively, the tape probe may be soldered to a test card and this card can be connected to the tester. This is an alternative to having a series of patterns on the substrate 12.

Given the system as illustrated in FIGS. 1 and 2, it is apparent that the cost of fabricating the tape probe is low. The frame or section of the tape with the probes are replaceable if they are worn or damaged in use. All that is required is to advance the tape 10 to a new lead configuration. Thus, only the tape portion of the probe system requires replacement. Additionally, the probes can be fabricated quickly and inexpensively for testing new chip designs, while maintaining the tape-tester configuration pattern. This can be done in a manner compatible with that of lead frame fabrication or tape automated bonding manufacturing. It will be appreciated that by using this technique wiring changes on the test apparatus may be reduced or eliminated.

Thus, as can be appreciated, this invention allows for electrical probing of fine pitch I/O pads situated anywhere on the surface of VLSI chips. Given the fact that the probes are mounted on a continuous tape, the probe elements are easily replaceable by simply indexing the tape to the next complete probe assembly. This provides test flexibility and reduced out-of-service time compared to conventional probe systems.

Importantly, given the cantilevered nature of the beams and the configuration at the tips, this allows for non-damaging contacting to the pads. The tips themselves become "sacrificial" since they are low cost. The overall test operation is cost effective since the yield of chips increases due to the decrease in damage and higher test respectability during the test regime.

Figure 4A:
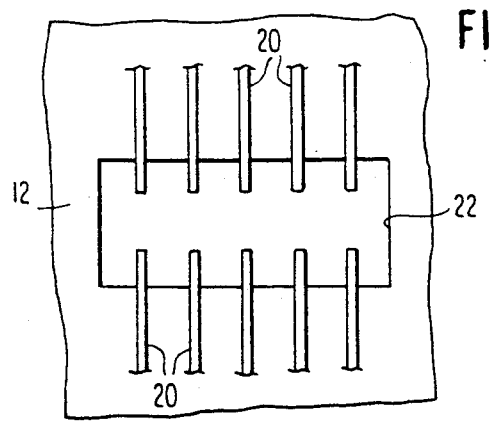
FIGS. 4A and 4B illustrate a top view and cross sectional view for purposes of explaining the mode of deflection of probes mounted in a rectangular window.

While the first preferred embodiment of this invention offers improved through-put, cost savings, reliability and the like, the placement of leads in a rectangular window in the polyimide results in distortion of the substrate when force is applied to the leads. By referring to FIG. 4A and 4B this phenomena is depicted. FIG. 4A is an enlargement of a single rectangular window 22 in the polyamide film 12. Metal circuitry for purposes of explanation is shown only on opposed sides.

Figure 4B:
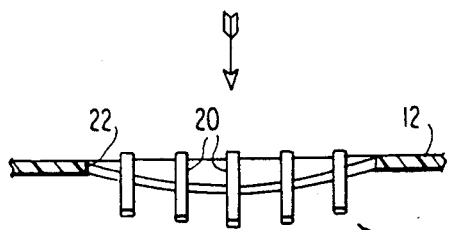

As illustrated in FIG. 4B, when a force is applied by the pressure anvil 38, the polyimide 12 tends to deflect and distort along the edge of the window. This is depicted in FIG. 4B as the region 13. The leads 20, as illustrated in FIG. 4B, are thus not planar. They will deflect as a function of the distortion of the polyimide film edge. While this lack of planarity for probing can be alleviated to some degree by making the rectangular window larger and concentrating the leads in a central portion of the edge, there is a potential problem of tearing and breakage of the substrate. Given the lack of planarity the probe tip leads on the polyimide film, when warped out of their common plane, make contact with a planer wafer surface unpredictable somewhat unreliable. This problem is alleviated by means of a freely bending supporting flap, which is illustrated as a second embodiment of this invention in FIG. 5.

As recognized in this technology, the flexible probe must provide for multiple electric contacts which protrude out of the plane of the flexible circuit in order to contact test lands on a wafer. This second embodiment is an improvement over the first embodiment by modifying the insulating substrate whether it be polyimide, Upilex or the like to allow access to the probe leads by out-of-plane mechanical deflection.

Figure 5:
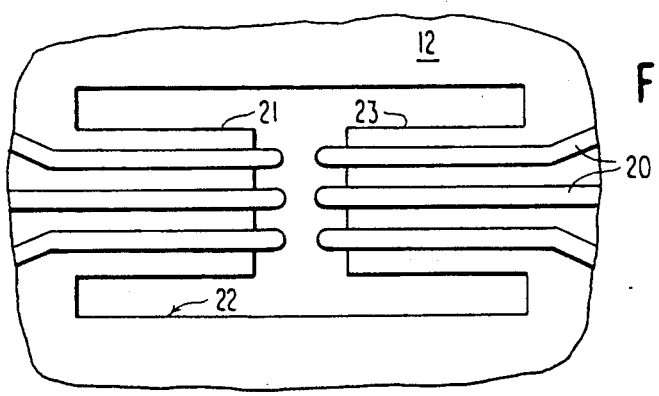
FIG. 5 is a bottom view of a probe configuration in accordance with a second embodiment of this invention.

FIG. 5 is a bottom view of the embodiment. A single-layer substrate 12 has a hole 22 which is H-shaped. The hole is etched through the polyimide. The leads in the form of metal tracings extend over the edge of the polyimide in an opposed relationship within the hole defined as a central arm of the H. By this geometry a pair of flaps 21 and 23 are defined on the substrate 12. The flaps themselves may be hinged out of the plane to flex while causing minimum deformation to the polyimide substrate itself.

Figure 6:
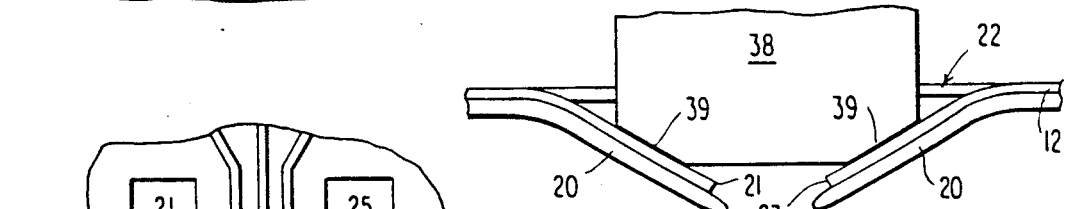
FIG. 6 is a side view of the second preferred embodiment of this invention illustrating the probe configuration in a deflected state.

By referring to FIG. 6, a side view of the probe configuration with the flaps deflected, it can be appreciated that when the polyimide flaps are hinged down, the tips of the flexed beams are oriented in such a manner that they can easily contact probe structures without the necessity of forming the ends of the leads. This occurs because the leads are co-planar on the deflected flap. That is, bumps that are used to compensate for differences in elevation and/or deflection of the probes and are not needed with this second embodiment.

This embodiment of the invention is not limited to a H-shape hole in the substrate.

Figure 7A:
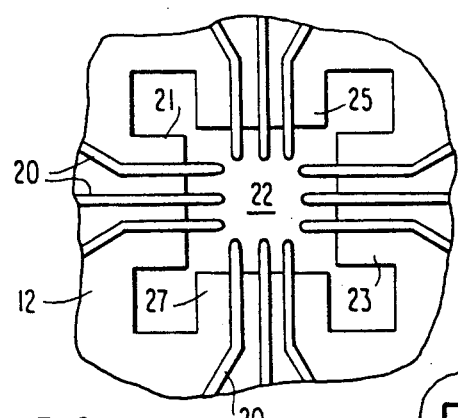
FIGS. 7A and 7B illustrate alternative configurations to that of FIGS. 5 and 6.
Figure 7B:
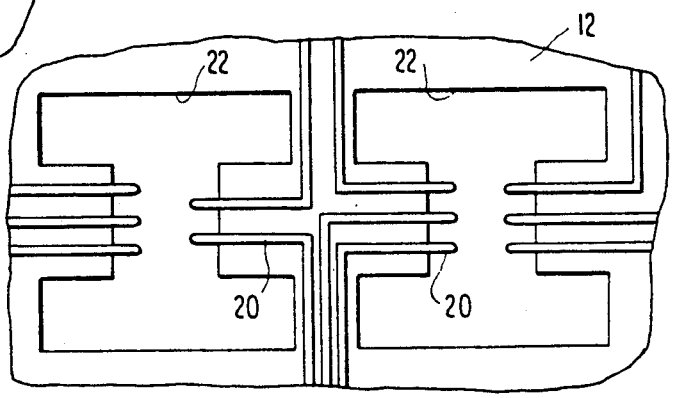

Referring to FIGS. 7A and 7B, two alternative configurations are illustrated. In FIG. 7A, a square opening is defined having cut-out corners. Thus, four flaps positioned at right angles are defined. This alternative to that as illustrated in FIG. 1A allows for uniform probing all the way around the window by having flaps which bend individually.

FIG. 7B illustrates yet another configuration utilizing multiple slots, each H-shaped, However, the slots are disposed in a relationship to each other so that common metallization can be used between flaps which are in common areas between the openings. Thus, FIG. 7A illustrates flaps 21 and 23 similar to that in FIG. 5 with a second pair of opposed flaps 25 and 27. Metallization 20 is disposed on each of the four flaps. The flaps are defined because the opening 22 has cut out corners.

In FIG. 7B, the openings 22 are the same as in FIG. 5. However, the metallization 20 shares a common pattern so that wiring requirements are minimized. In each embodiment, the substrate is excised, for example, by etching to create a mechanical structure which maintains its integrity when hinged out-of-plane. The formation of these flaps provide the technique by which the probes maintain their essential planarity to provide for uniform contacting.

The probe tips illustrated in FIGS. 5, 6 and 7 are all essentially straight without any treatment of the tips. Thus, the simplest approach, which is acceptable, is simply to use the end of an etched lead as the probe tip, as illustrated in FIG. 6. Such a probe can also be formed by excising the lead in a die to create two probe tips facing each other within a window. Thus, for a symmetrical arrangement, as illustrated in FIGS. 5, 7A and 7B, individual metallization can simply be cut to provide a pair of opposed tips.

Figure 8A:
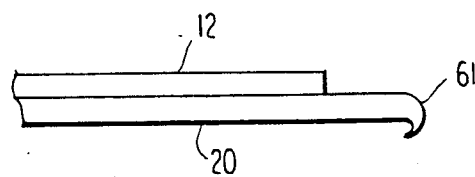
FIGS. 8A, 8B, and 8C illustrate schematic side views of lead ends for purposes of illustrating suitable shapes for probing.
Figure 8B:
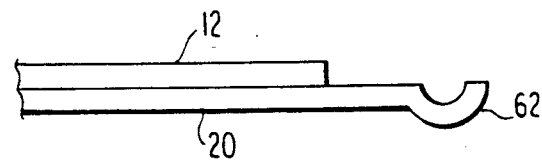
Figure 8C:
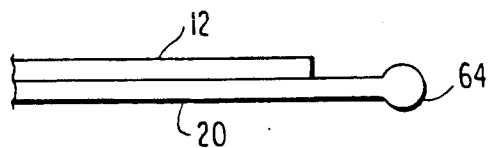

FIG. 8 illustrates three alternative probe tips, which can be used depending on the topology of the device being tested. The ends of the leads from the probe 20 can be coined to provide a downwardly extending point 61. This is illustrated in FIG. 8A. Alternatively, a curve or bend 62 can be provided such that a rounded contact area is established. Such is illustrated in FIG. 8b. Alternatively, a spheroid 64 can be formed using the technology disclosed in U.S. Pat. No. 4,814,855.

In terms of alternative materials, gold or nickel plated copper probes are easiest to manufacture commercially and provide for the most inexpensive metallurgy. TAB technology routinely utilizes gold plated copper. Consequently, for all of the embodiments of this invention probes utilizing that metallurgy can be fashioned utilizing known techniques.

There are however, several cases where the integrity of the probe contact using gold plated copper is inadequate. For example, one major problem encountered in pad probing is that of breaking through the pad surface oxide. This occurs because the probe material is harder than the surface of the pad. Conversely, if the probe material is softer than the surface of the pad, this breaking of the pad surface oxide may not be readily accomplished but the probe head will suffer considerable deformation. Such a flattened probe will have a much greater contact area for its next use. Consequently, the force instead of being applied at a point yielding a very high pressure, as in the case of the embodiments illustrated in FIGS. 8A, 8B and 8C, it will be distributed over a wide area which reduce the chances of sufficient contact being made.

While tape probes are replaceable utilizing spooling techniques and the like there is a cost associated in terms of time and materials. Consequently, there are a number of requirements for metal alloys to make them suitable for use as probes. First, the probe must be sufficiently hard to penetrate oxide layers on the pads. Secondly, the probe must be repeatedly used without head deformation. Thirdly, if laser balling is desired, the metal must be suitable for this processing step. Fourth, an oxide free surface must be provided without plating, and finally, a long wearing surface resistant to abrasive removal is necessary.

An alloy satisfying these requirements is composed of nickel and copper. Nickel-copper is an inexpensive material which is suitable for tape manufacture. There are a continuous range of Ni-Cu alloys available. For example, Ni(30%)-Cu(70%) is three to four times harder than pure copper yet resistant to oxidation.

There are other examples of alloys which meet the physical requirements for probing but which are more expensive and difficult to work with. Other candidates are alloys of gold, such as Neyoro-G and Paliney-7 manufactured by Ney Company of Bloomefield, Conn. The melting points of these two alloys are slightly lower than that of copper, 925° C. and 1015° C. respectively. They are thus also candidates for laser ball formation.

An advantage of nickel-copper is that the alloy is harder than copper and it does not oxidize. Consequently, surface plating with gold is not required. Continuous use and therefore the wear of the tip will not expose an oxidizable underlying metal since the probe heads are composed entirely of the same material.

Figure 9A:
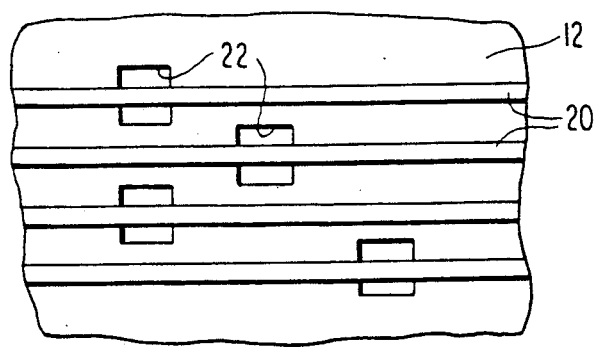
FIGS. 9A, 9B and 9C are a top view and side views respectively of a third embodiment of this invention for area array probe structures.
Figure 9B:
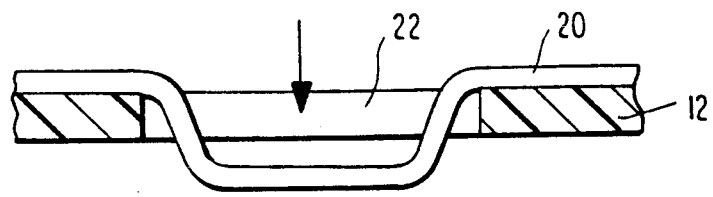
Figure 9C:
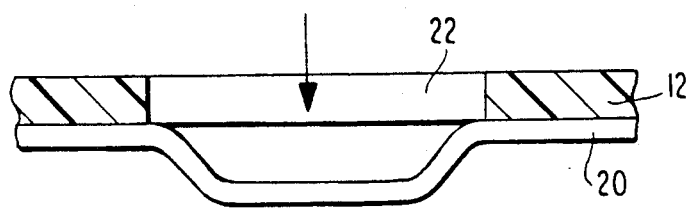

A fourth embodiment of this invention is depicted in FIGS. 9A, 9B and 9C. This embodiment deals with an area array and is a modification of the structure illustrated in FIG. 1C. The implementation is illustrated in FIGS. 9A and 9B. In this embodiment windows are etched through the substrate where a probe contact is desired. The metallization 20 overhangs the window and is then formed down through the window by utilizing a precision die rollers, or other forming devices. In this manner, the leads protrude from the insulating polyimide structure to make contact with the wafer beneath. This is illustrated in FIG. 9B and 9C.

Thus, in all of these embodiments, the fine pitch probes mounted on a flexible membrane can be used in a reel-to-reel mode. This provides for automated replacement when the probe tips wear. Thus, as illustrated in FIG. 2A such a reel-to-reel set up can be used for the embodiments of FIGS. 5, 7, and 9 in addition to those illustrated in FIG. 1. Alternatively, individual frames containing one or more flex probes can be excised and mounted in the structure to be placed within a probe head.

It will be apparent to those of working skill that modifications in this invention may be practiced. For example, while the invention allows for automatic tape probe replacement to allow reel-to-reel handling of probes that same flexibility permits multi-site probing. That is, multiple chip-sites can be probed simultaneously to increase the through put of the test process. This would involve having multiple testers between the supply and take up reels.

Additionally, different probe patterns can be used on the same tape. This permits indexing the tape to allow it to be used for testing of different chip pad configurations on a parallel basis.

Additionally given the ease of handling of the TAB frame once it is mounted on a small cardlet (e.g., a piece of PC board), this might make the probing and TAB replacement more convenient. Thus, a carousel or magazine of TAB frames can be arranged on small cards, rather than the reel-to-reel format. This would also be attractive for the situation wherein the TAB yield is low, allowing pre-selection and test.

This invention also allows for multi-site probing. Thus, multiple chip sites on a wafer can be probed simultaneously thus increasing the through put of the tester.

Other improvements and modifications can be practiced without departing from the essential scope of this invention.

We claim:

1. An apparatus for testing an electronic device having a plurality of contact locations on a surface thereof, comprising:
   a film tape having a dielectric layer, a plurality of conductive beam leads thereon; an aperture in said layer, said beam leads positioned such that they project into said aperture;
   means for moving said entire tape essentially in a plane of said tape to position said beam leads for testing said electronic device; and
   means for pressing said beam leads into engagement with said contact locations on said electronic device.

2. The apparatus of claim 1 wherein said tape comprises a plurality of layers, at least one being a ground plane.

3. The apparatus of claim 1, wherein ends of said beam leads projecting into said aperture extend to different lengths.

4. The apparatus of claim 1, wherein said tape is a polymer film having a conductive pattern.

5. The apparatus of claim 4, wherein said pattern comprises a first array of conductors connected to a first array of beam leads and a second array of conductors connected to a second array of beam leads, wherein said first array of conductors is a pattern different from that of said second array of conductors.

6. The apparatus of claim 1, wherein said means for pressing comprises an anvil positioned over said aperture to press inner beam ends projecting into said aperture.

7. The apparatus of claim 6, further comprising an elastomer layer on said anvil, said elastomer contacting said inner beam ends.

8. The apparatus of claim 6, wherein said anvil comprises a transparent material.

9. The apparatus of claim 8, further comprising an alignment hole in said tape, said tester interface comprising a movable pin to place said tape into alignment with said tester interface by engaging said alignment hole and moving said tape.

10. The apparatus of claim 8, further comprising an optical sensor to sense the position of said tape aperture relative to said tester interface.

11. The apparatus of claim 1, further comprising a tester interface, said tape having plurality of contacts on said interface to selectively establish electrical continuity between beam leads and said tester interface.

12. The apparatus of claim 1, wherein each of said beam leads projects in cantilevered fashion into said aperture.

13. The apparatus of claim 12, wherein each of said beam leads terminates in a downward extending point.

14. The apparatus of claim 12, wherein each of said beam leads terminates in a U-shape.

15. The apparatus of claim 12, wherein each of said beam lends terminates in a spherical shape.

16. An apparatus for testing an electronic device having a plurality of contact locations on a surface thereof, comprising:
 a tape having a dielectric layer, a plurality of beam leads on said tape;
 an aperture in said layer, said beam leads positioned such that they project into said aperture;
 means for advancing said tape to a position for testing said electronic device; and
 means for pressing said beam leads into engagement with said contact locations on said electronic device; wherein said aperture defines a pattern in said tape providing for a tape flap, said flap deflectable by said means for pressing, and said beam leads mounted on said flap.

17. The apparatus of claim 16, wherein said aperture is an H-pattern providing for two opposed flaps and said beam leads are mounted on each of said flaps.

18. The apparatus of claim 16, wherein said aperture defines a pattern having four flaps positioned on sides of a rectangle and said beam leads define four sets each projecting into said aperture.

19. An apparatus for testing an electronic device having a plurality of contact locations on a surface thereof, comprising:
 a tape having a dielectric layer, a plurality of beam leads on said tape;
 a first aperture in said layer, a plurality of first beams leads of said beam leads positioned such that they project into said first aperture;
 means for advancing said tape to a position for testing said electronic device;
 means for pressing said beam leads into engagement with said contact locations on said electronic device; wherein said tape comprises a second aperture a plurality of second beam leads of said beam leads pass over and project into said second aperture.

20. The apparatus of claim 19, wherein said first and second beam leads are parallel to each other.

21. The apparatus of claim 19, wherein said first aperture and said second aperture are staggered on said tape.

22. Apparatus for interfacing with electronic devices comprising:
 a tape having a plurality apertures, a plurality of patterned leads having terminals, each pattern of leads defining a deflectable temporary contact array to one of said electronic devices, each contact array positioned relative to one of said plurality of apertures and projecting into said aperture, said apertures each with an associated pattern of leads spaced on said tape; and an alignment hole in said tape relative to each aperture.

23. The apparatus of claim 22 wherein said alignment hole comprises a through-hole for engaging a pin to align said tape with a device under test.

24. The apparatus of claim 22 wherein said alignment hole comprises a hole remote from said contact array for providing an optical window to determine the position of said tape.

25. The apparatus of claim 22 further comprising a metallic layer on a surface of said tape to act as a ground plane.

26. The apparatus of claim 25 wherein each of said plurality of patterned leads terminates on said tape in a pattern of contacts, said pattern of contacts being the same for said first and second contact arrays.

27. The apparatus of claim 22 wherein said plurality of patterned leads comprises a first and second contact arrays wherein said first contact array has a pattern of leads projecting into a first aperture different from a pattern of leads in said second contact array projecting into a second aperture.

28. Apparatus for interfacing with an electronic device comprising;
 a flexible elongate tape substrate having a plurality of apertures, a first aperture of said plurality of aperture in said substrate, said substrate having a first flap extending into said first aperture and deflectable out of the plane of said substrate, and plural test leads mounted on said first flap and extending into said first aperture.

29. The apparatus of claim 28 further comprising a second flap extending into said first aperture and a second beam leads mounted on said second flap and extending into said aperture.

30. The apparatus of claim 29 wherein said first flap and second flap oppose each other in said aperture.

31. The apparatus of claim 29, wherein said first flap and said second flap are at right angles to each other.

32. The apparatus of claim 28, wherein each of said beam leads is an alloy of nickel and copper.

33. The apparatus of claim 28, further comprises means to deflect said flap downward out of plane of said substrate whereby each of said beam leads contacts said electronic device.

34. The apparatus of claim 33, wherein said means to deflect said flap comprises a pressure anvil, said anvil having a leveled bearing surface contacting said substrate.

35. The apparatus of claim 28, wherein said substrate comprises an individual frame.

36. The apparatus of claim 28, further including means for containing a plurality of flexible substrates.

37. The apparatus of claim 36, wherein said means for containing is a carousel.

38. The apparatus of claim 36, wherein said means for containing is a magazine.

* * * * *